(12) United States Patent
Grutzediek et al.

(10) Patent No.: US 7,271,070 B1
(45) Date of Patent: Sep. 18, 2007

(54) METHOD FOR PRODUCING TRANSISTORS

(76) Inventors: Hartmut Grutzediek, An der Klosterheck 16, D-55130 Mainz (DE); Joachim Scheerer, Am Fort Weisenau 38, D-55130 Mainz (DE)

( * ) Notice: Subject to any disclaimer, the term of this patent is extended or adjusted under 35 U.S.C. 154(b) by 0 days.

(21) Appl. No.: 09/806,224

(22) PCT Filed: Aug. 13, 1999

(86) PCT No.: PCT/EP99/05942

§ 371 (c)(1),
(2), (4) Date: Jun. 11, 2001

(87) PCT Pub. No.: WO00/19503

PCT Pub. Date: Apr. 6, 2000

(30) Foreign Application Priority Data

Sep. 29, 1998 (DE) ................................ 198 44 531

(51) Int. Cl.
*H01L 27/416* (2006.01)
(52) U.S. Cl. ...................... 438/323; 438/324; 438/328; 438/335; 438/350; 438/370; 438/376; 257/E27.015; 257/E27.023; 257/E31.069
(58) Field of Classification Search ................ 438/323, 438/324, 328, 335, 350, 370, 376, FOR. 166, 438/FOR. 215; 257/E27.015, E27.023, E31.069
See application file for complete search history.

(56) References Cited

U.S. PATENT DOCUMENTS

| 3,925,120 A | 12/1975 | Saida et al. ................. 148/175 |
| 3,981,072 A * | 9/1976 | Buie .......................... 257/526 |

(Continued)

FOREIGN PATENT DOCUMENTS

EP    0 032 022    7/1981

(Continued)

OTHER PUBLICATIONS

Cheung, N.. W., "Buried Dopant and Defect Layers for Device Structures With High-Energy Ion Implantation", Nuclear Instreuments and Methods in Physics Research B37/38 (1989) pp. 941-950.*

(Continued)

*Primary Examiner*—George Pourson
(74) *Attorney, Agent, or Firm*—Heslin, Rothenberg, Farley & Mesiti PC; Jeff Rothenberg

(57) ABSTRACT

The invention relates to a method for producing integrable semiconductor components, especially transistors or logic gates, using a p-doped semiconductor substrate. First of all, a mask is applied to the semiconductor substrate in order to define a window that is delimited by a peripheral edge. An n-doped trough is then produced in the semiconductor substrate by means of ion implantation using an energy that is sufficient for ensuring that a p-doped inner area remains on the surface of the semiconductor substrate. The edge area of the n-doped trough extends as far as the surface of the semiconductor substrate. The other n-doped and/or p-doped areas that make up the structure of the transistor or logic gate are then inserted into the p-doped inner area of the semiconductor substrate. The inventive method is advantageous in that it no longer comprises expensive epitaxy and insulation processes. In an n-doped semiconductor substrate, all of the implanted ions are replaced by the complementary species; i.e. n is exchanged for p and vice versa.

28 Claims, 16 Drawing Sheets

U.S. PATENT DOCUMENTS

| | | | | |
|---|---|---|---|---|
| 4,239,558 A | * | 12/1980 | Morishita et al. | 257/500 |
| 4,355,320 A | | 10/1982 | Tihanyi | 357/30 |
| 5,124,770 A | | 6/1992 | Umemoto et al. | 357/22 |
| 5,292,671 A | * | 3/1994 | Odanaka | 438/433 |
| 5,670,822 A | | 9/1997 | Jang | 257/565 |
| 5,821,145 A | * | 10/1998 | Goo | 438/294 |
| 5,837,590 A | * | 11/1998 | Latham et al. | 438/364 |
| 5,858,828 A | * | 1/1999 | Seliskar et al. | 438/234 |

FOREIGN PATENT DOCUMENTS

| | | | |
|---|---|---|---|
| EP | 032022 A1 | * | 7/1981 |
| EP | 0 260 955 | | 3/1988 |
| EP | 0 294 868 | | 12/1988 |
| EP | 0 339 386 | | 11/1989 |
| JP | 51 073887 | | 6/1976 |
| JP | 57 024548 A | | 2/1982 |
| JP | 04094545 A | | 3/1992 |
| JP | 05226351 A | | 9/1993 |
| JP | 09027551 A | * | 1/1997 |
| WO | WO98/36457 | | 8/1998 |

OTHER PUBLICATIONS

Patent Abstracts of Japan, vol. 006, No. 091, May 28, 1982, (JP 57 024548 A, Nippon Telegraph & Telephone Corp., Feb. 9, 1982.).

* cited by examiner

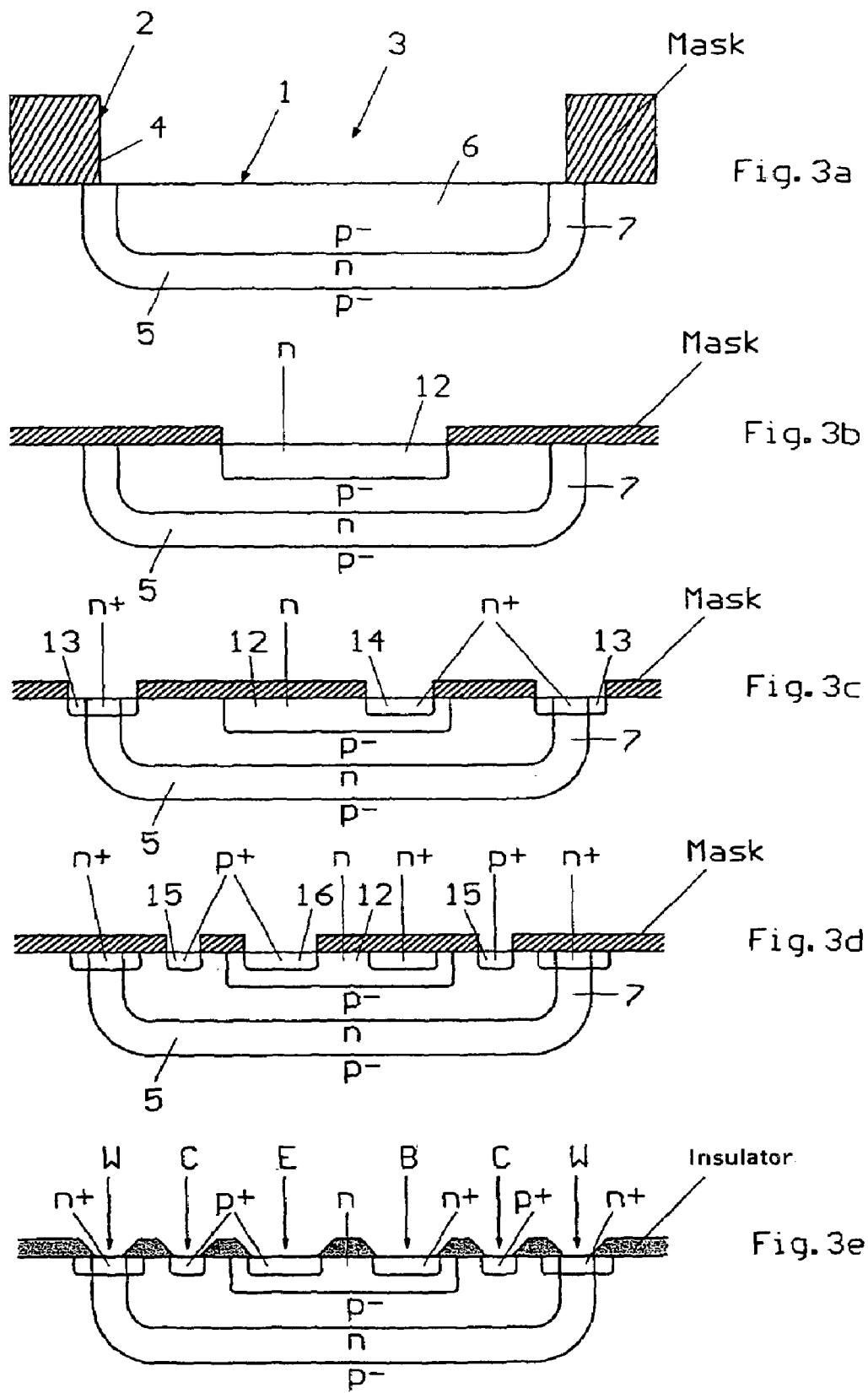

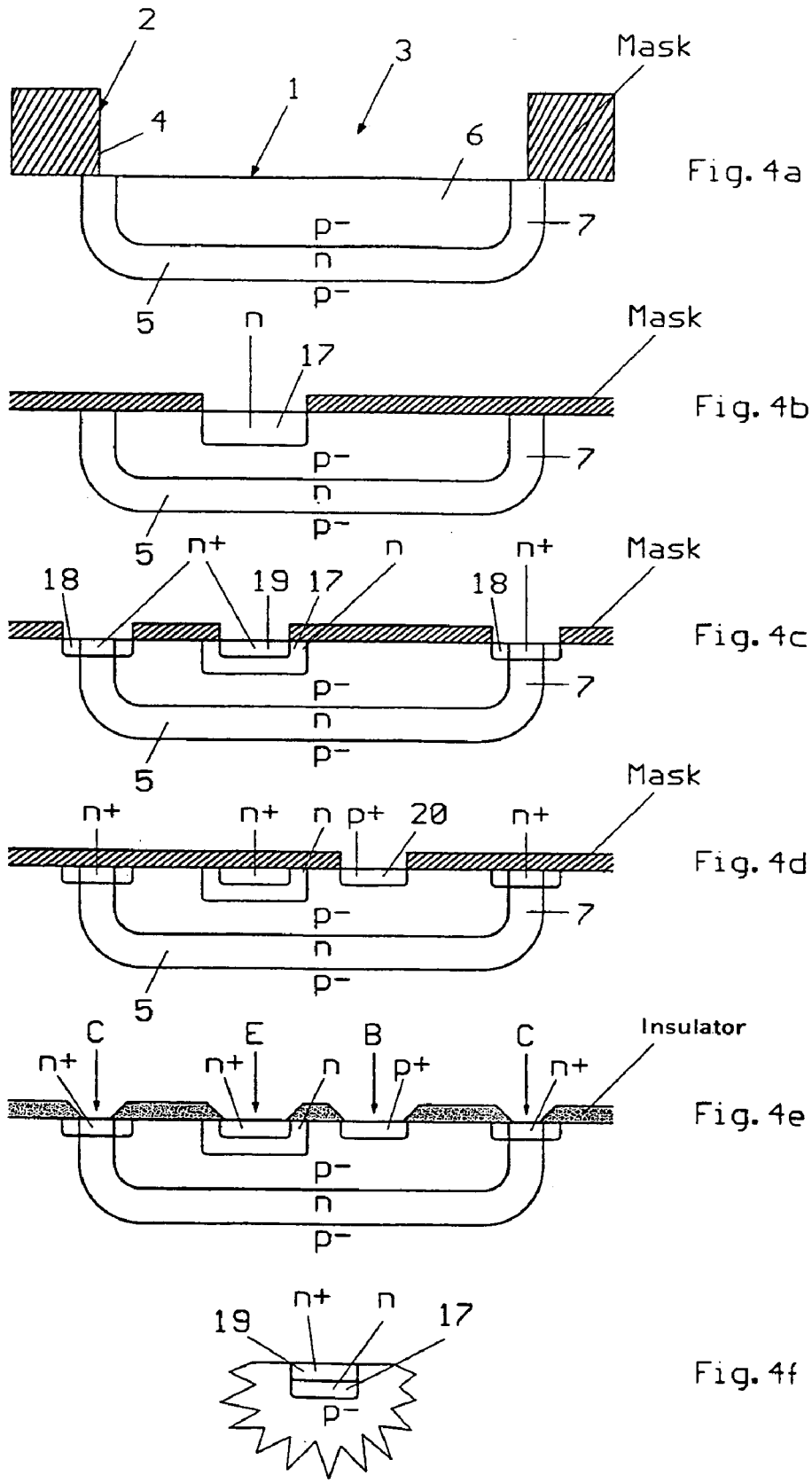

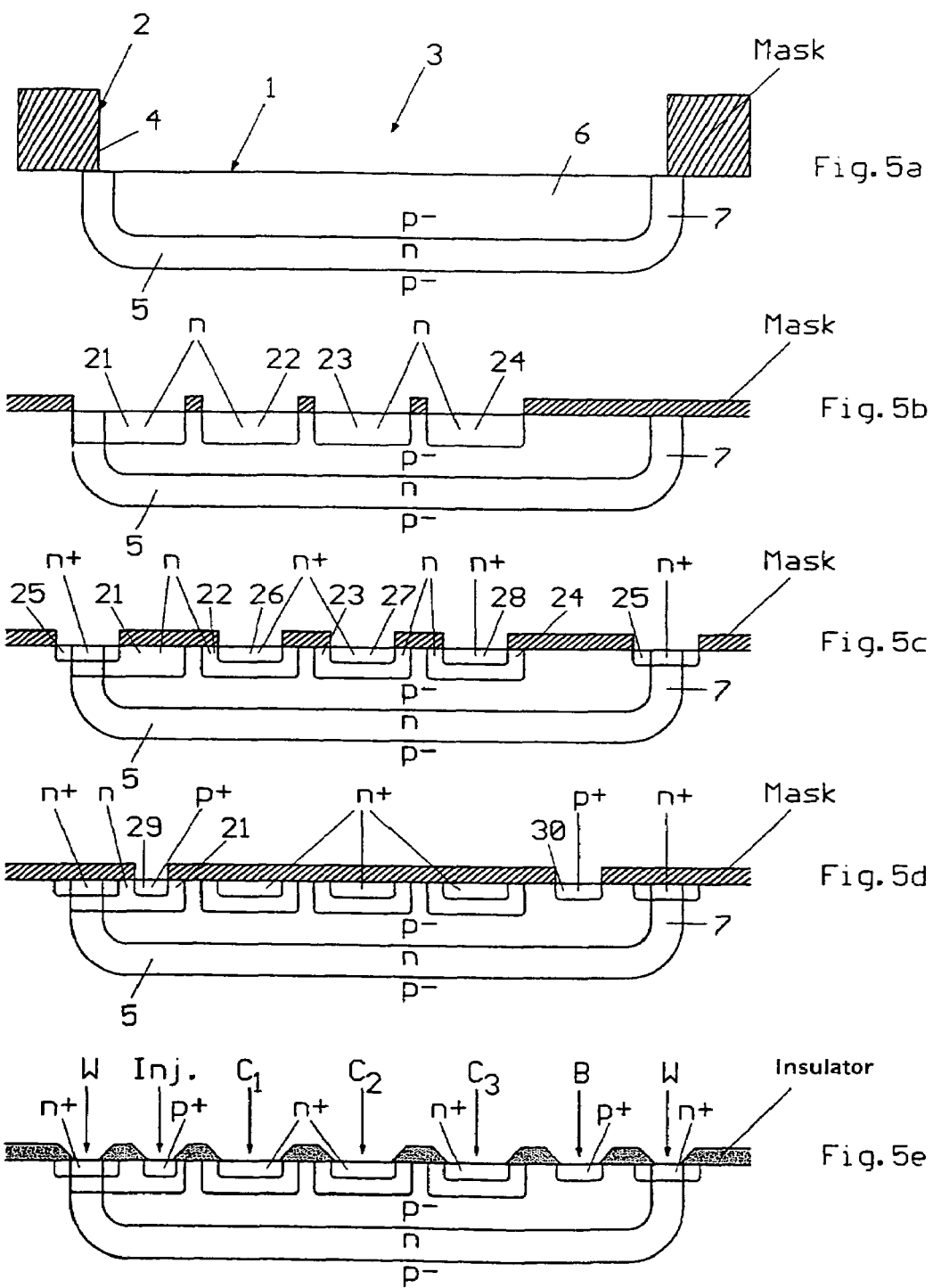

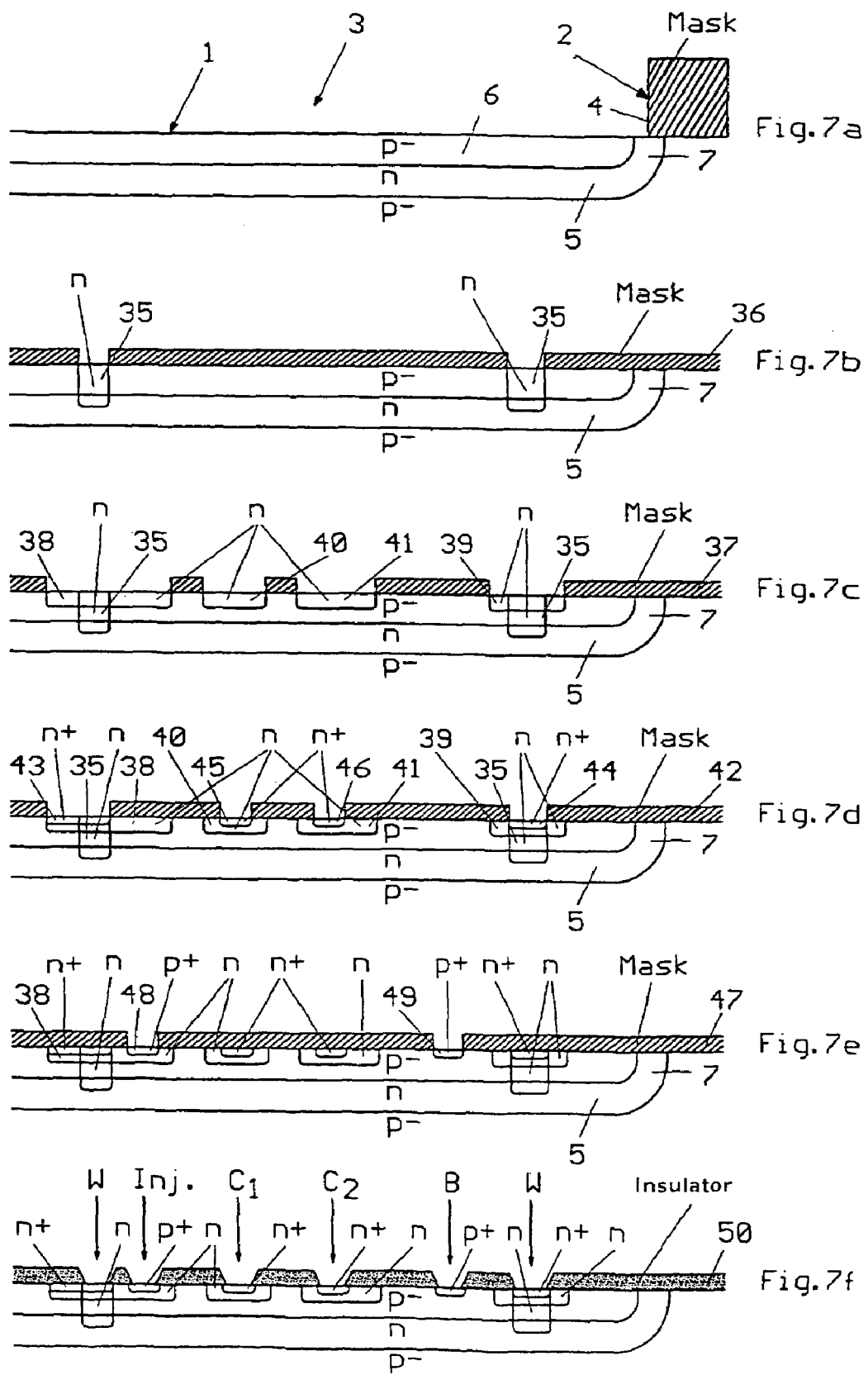

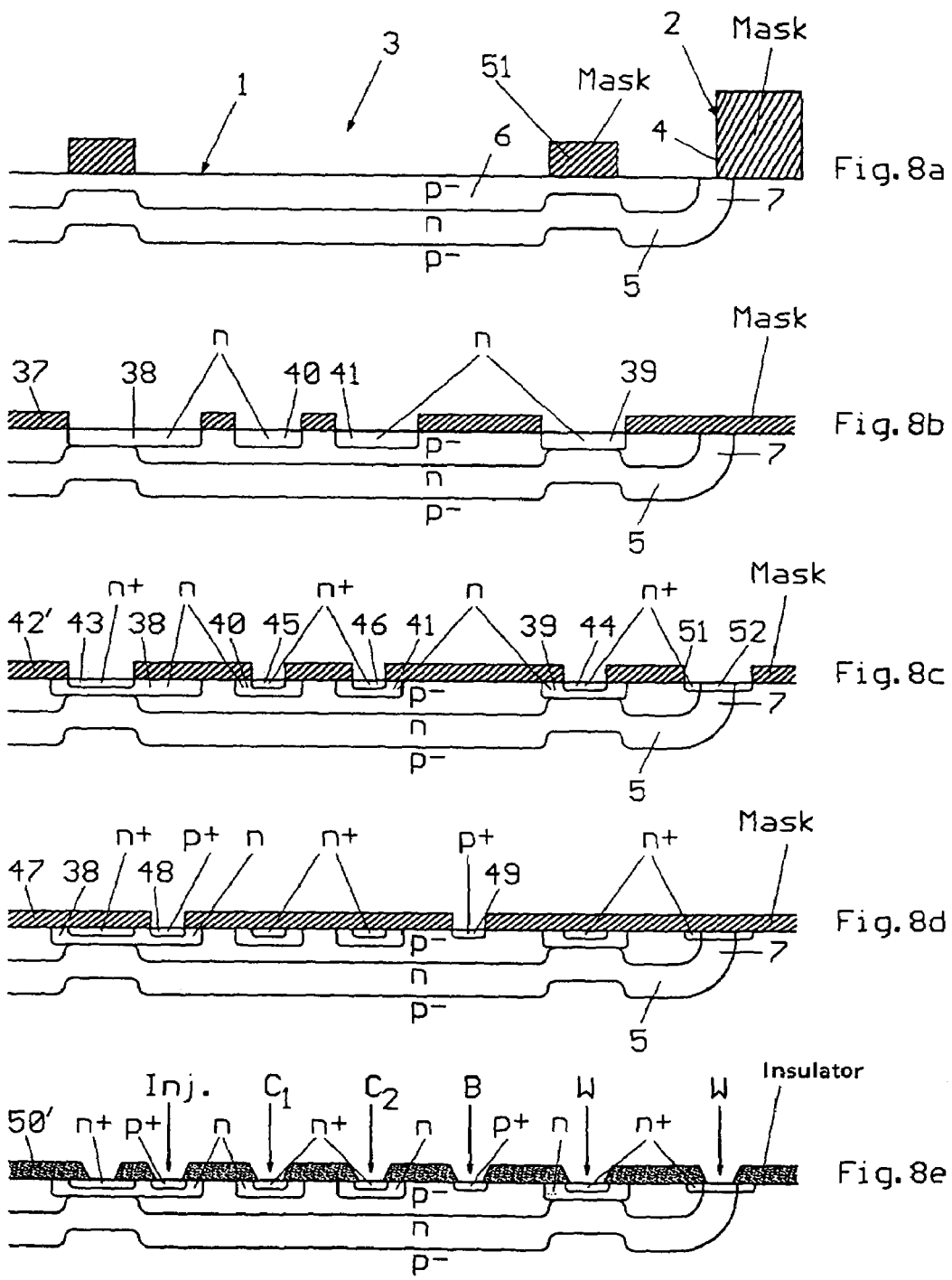

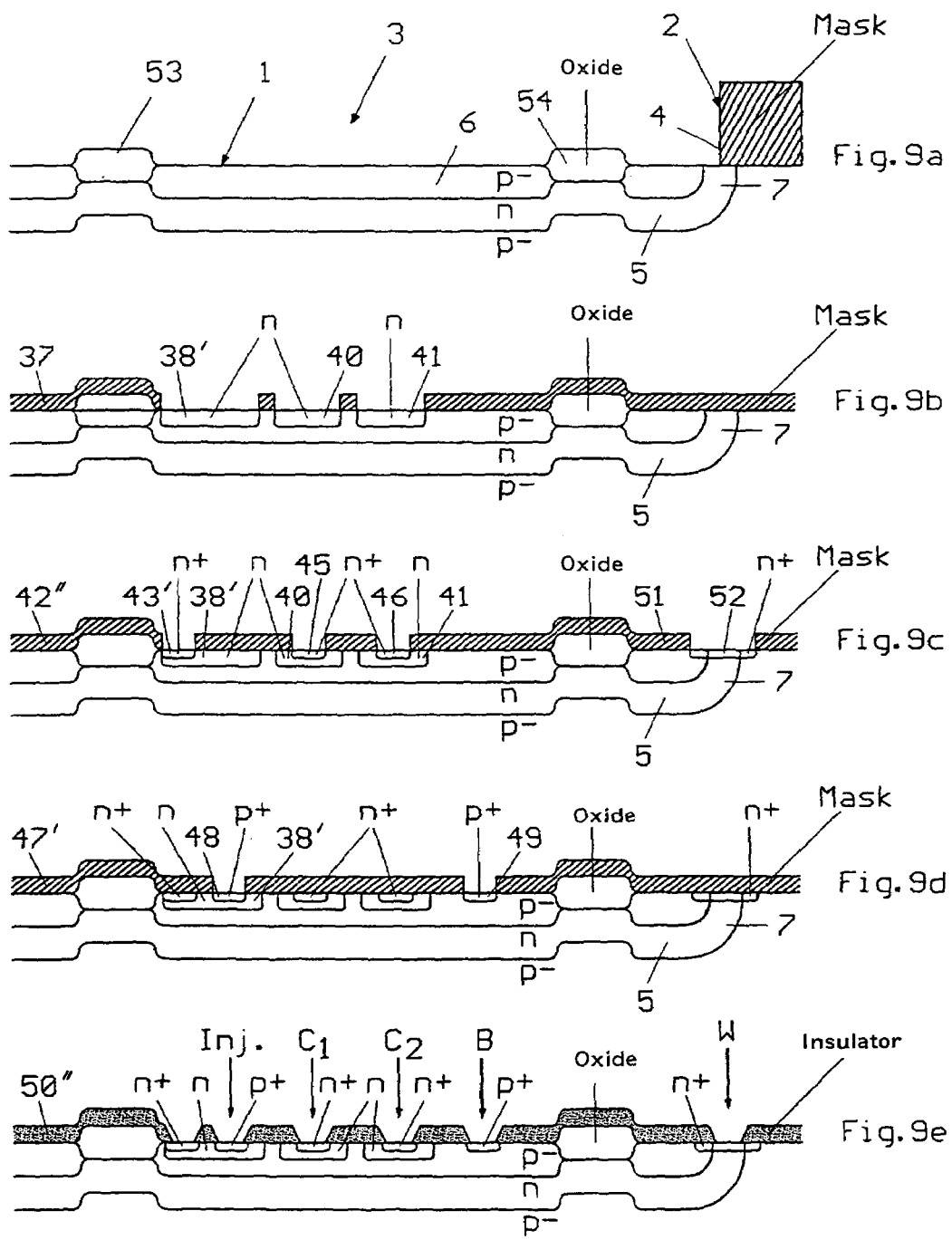

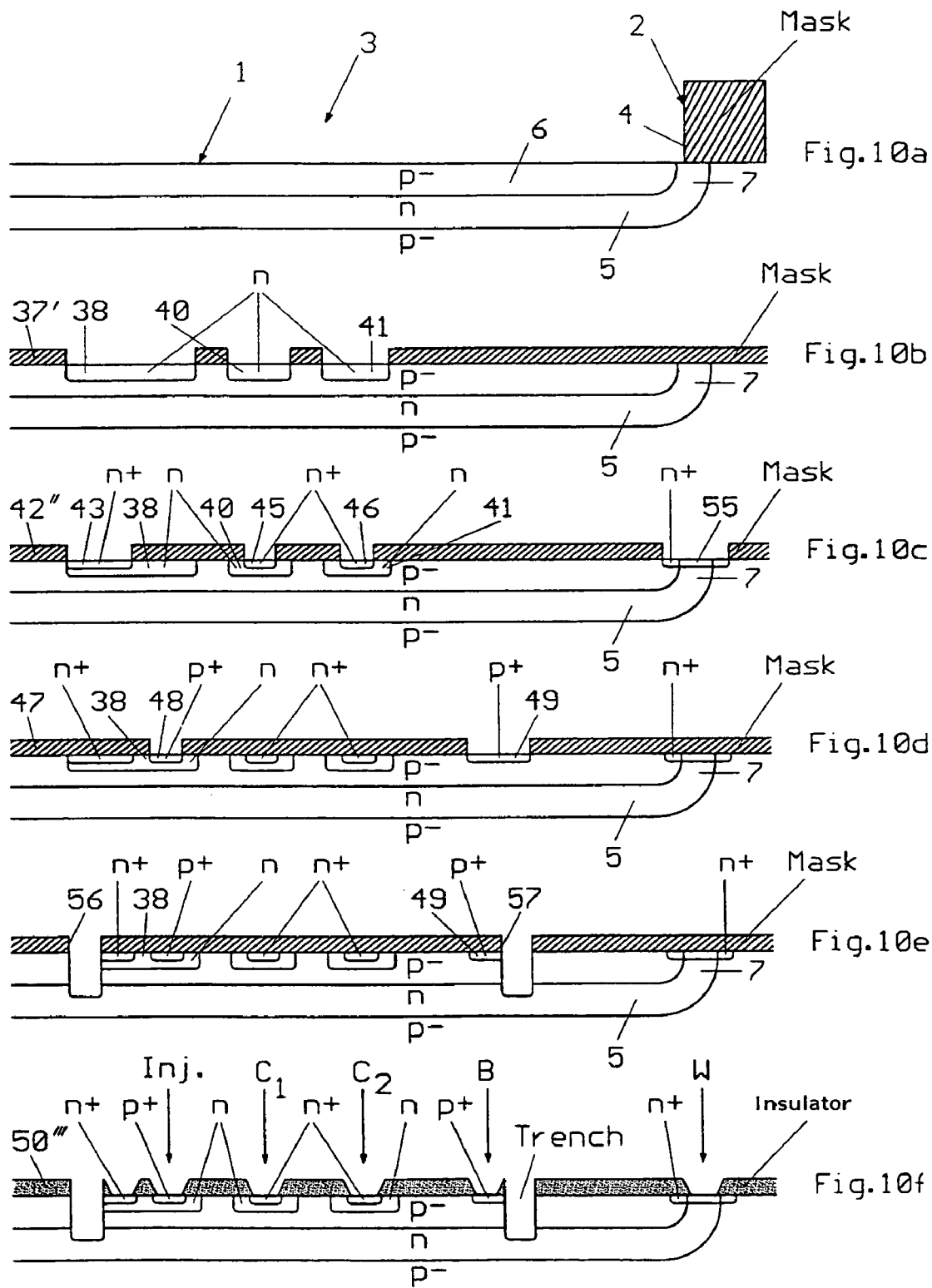

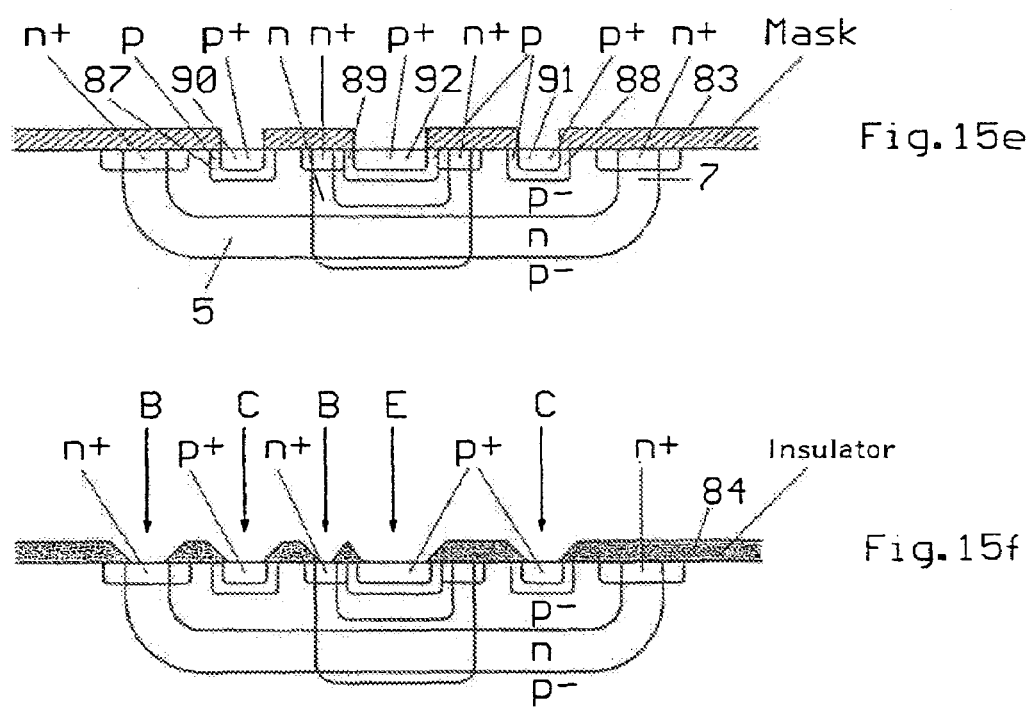

METHOD FOR PRODUCING TRANSISTORS

The present invention concerns a process for producing integrable transistors.

A number of processes are known in the art for producing pn-junctions in semiconductor components and include diffusion, epitaxy, and ion implantation.

A brief overview of the diverse processes used in producing bipolar transistors is provided in the published article, "Advances in Bipolar VLSI" by George R. Wilson in *Proceedings of the IEEE*, Vol. 78, No. 11, 1990, pp. 1707-1719.

In the following, a standard process for producing bipolar transistors is described in detail. Initially, for production of bipolar transistors a subcollector area, also called a buried layer, is diffused into a p-doped semiconductor substrate by which the semiconductor collector series resistance of the transistor can be effectively reduced. Then the semiconductor substrate is coated with an epitactically n-conductive layer. Thereafter electrically isolated areas are partitioned in the epitactic layer. Insulation of these so-called epi-islands is done using the pn-transition layers poled in reverse bias, which are created by deep-diffused p-areas. This is followed by additional diffusion steps with which the base and emitter areas of the NPN-bipolar transistor are defined. Following this, bonding for the transistor terminals is carried out.

In the practice, the standard bipolar process using film insulation has stood the test of time. However, the costly epitaxy and insulation process has been a disadvantage. P-channel field effect transistors with low threshold voltages can be realized using the standard bipolar process only with modifications.

Therefore, the purpose of this invention is to provide a simplified process for producing various types of transistors in a common manufacturing process.

The distinct advantage of the process described in the invention is that an epitaxy and insulation process as used in the standard bipolar process is no longer necessary.

In the process described in the invention an n-doped trough is produced by high-energy implantation in the preferably weakly p-doped semiconductor substrate. The ion implantation is done using an energy that assures that a p-doped inner area remains on the surface of the semiconductor substrate, while the fringe area of the n-doped trough extends as far as the surface of the semiconductor substrate.

It is also possible to carry out ion implantation using an energy that is not sufficiently high as to leave a p-doped inner area at the surface of the semiconductor substrate, but produces a weakly n-doped inner area. In this instance the p-doped inner area is produced in that the back-scattered ions are compensated using p-doped materials. Said compensation can be done using ion implantation or diffusion with or, over larger areas, without the use of a mask.

Alternatively an n-doped semiconductor substrate can be used as the basis. In this instance all implant ions are replaced by a complementary species; that is, n-implant ions are substituted for p-implant ions and vice versa. The semiconductor substrate is preferably a weakly p-doped or n-doped semiconductor substrate.

On the basis of the semiconductor structure described in the foregoing both NPN-transistors and PNP-transistors can be manufactured in the most various embodiments. To achieve this, additional n-doped and/or p-doped areas forming the transistor structure are inserted into the p-doped inner area of the semiconductor substrate.

In order to produce the n-doped trough, a mask is applied to the semiconductor substrate and defines a window that is bordered by a peripheral edge. Independent of the formation of the edge of the window, a deep n-doped trough is inserted into the semiconductor substrate using ion implantation. The fringe area of the trough extends as far as the surface of the semiconductor substrate. The formation of the fringe zone that extends as far as the surface of the semiconductor substrate is explained by the fact that the ions are slowed at different rates at a vertical edge and at a slanted edge.

On the basis of the semiconductor structure described in the foregoing, an NPN-transistor can be produced simply and without great cost in that a p-doped area with heavier doping that that of the semiconductor substrate is produced in the p-doped inner area of the semiconductor substrate. Said p-doped area with the heavier doping then forms the base of the transistor. A preferable highly n-doped area that is inserted into the p-doped area then forms the emitter of the transistor. Since the fringe area of the n-doped trough that serves in this instance as the collector reaches as far as the surface of the semiconductor substrate, the collector connection via the strongly n-doped area can be easily made in this semiconductor structure.

In order to create a semiconductor structure for a PNP-transistor, an n-doped area is created in the p-doped inner area. Said area forms the basis of the transistor. In the n-doped area enclosed by the p-doped inner area a preferably highly p-doped area forming the emitter of the transistor is created. The p-doped inner area then forms the collector of the transistor.

The production of the n-doped and/or p-doped area in the semiconductor substrate can be accomplished using process steps known to those skilled in the art. It is advantageous if the shallow areas; i.e., those close to the surface are produced by ion implantation.

The areas in which ions are to be implanted can be defined using conventional masking processes. The masking material can consist of a photoresist, metal, glass or other material. Preferably the structure of the areas to be doped and defined using masks is marked using lithographic methods. Also possible are combinations of lithography and etching methods.

For the ohmic contact of the transistor terminals, additional n-doped and/or p-doped junction areas with a heavier doping can be inserted into the semiconductor structure.

An NPN-transistor can also be created in that an n-doped area is produced in the p-doped inner area which forms the emitter of the transistor. In this embodiment, the p-doped inner area then forms the base and the n-doped trough forms the collector of the transistor. It has been shown that this NPN-transistor demonstrates high gain.

On the basis of the semiconductor structure with the elevated trough described in the foregoing, $I^2L$ (Integrated Injection Logic) or field effect transistors can be produced inexpensively.

Furthermore, on the basis of said semiconductor structure, also logic gates with high packing density can be produced. To achieve this, the active regions of the logic gate must be partitioned in the semiconductor structure. The semiconductor structure using the elevated trough also allows photosensitive diodes and transistors to be produced inexpensively.

The separation can be done by ion implantation using a supplemental mask. When done in this manner, the area of the trough covered by the mask is drawn upwards. Over said elevated trough area either an n-doped area or an oxide layer extending as far as the trough is produced in the p-doped inner area. Instead of the coverage by the mask the trough can be elevated also using local oxidation that is done prior.

Alternatively, the separation of the active areas can be done also using n-doped areas which extend into the trough. A further possibility for separation is done by providing the semiconductor substrate with slots or incisions that extend into the trough (trench insulation).

In the following, several illustrative embodiments of the process for producing transistors or logic gates are described by detailed reference to the accompanying drawings, wherein:

FIGS. 3a to 3e depict the further process steps for producing a PNP-transistor starting with the semiconductor structure depicted in FIGS. 1a to 1c;

FIGS. 4a to 4f depict the further process steps for producing an alternative embodiment of an NPN-transistor that is characterized by a high gain and based on the semiconductor structure depicted in FIGS. 1a to 1c;

FIGS. 5a to 5e depict the individual process steps for producing an I²L (Integrated Injection Logic) element, starting with the semiconductor structure depicted in FIGS. 1a to 1c;

FIGS. 7a to 7f depict the individual process steps for producing a logic gate with implanted insulation;

FIGS. 8a to 8e depict the individual process steps for producing a logic gate with low-frequency modulated trough and implanted insulation;

Figure 12A:
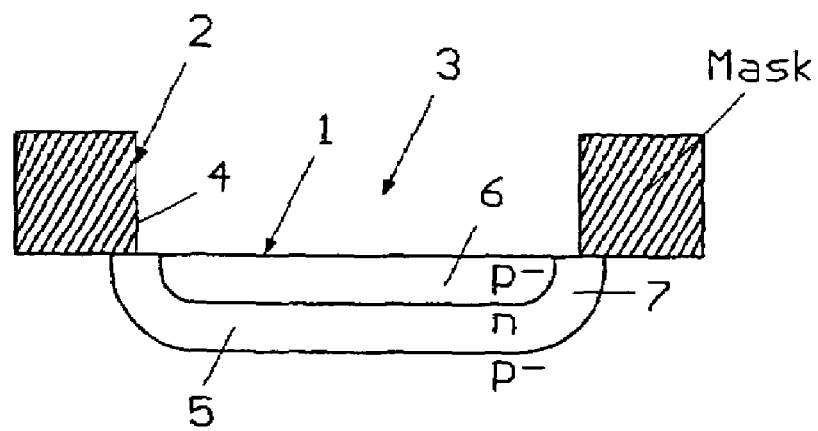
Figure 12B:
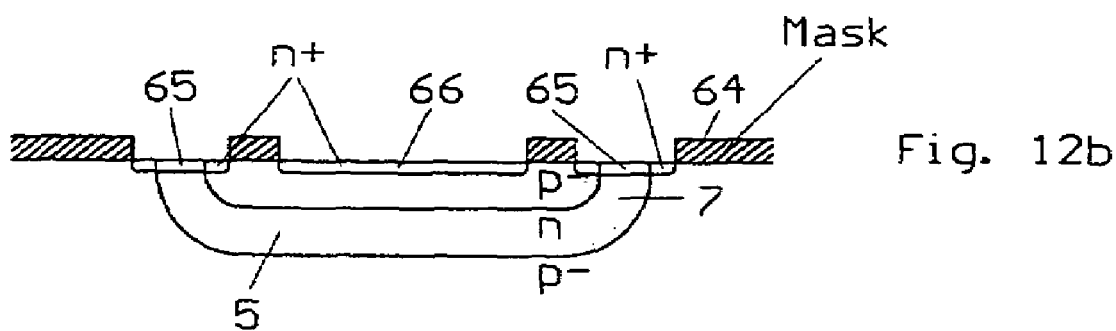
Figure 12C:
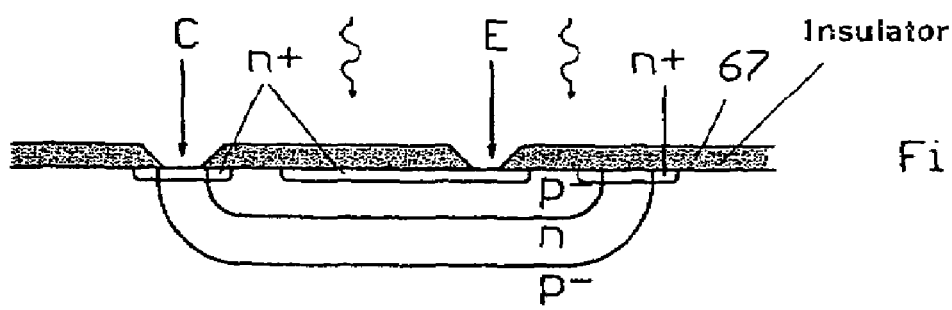

FIGS. 9 a to 9e depict the individual process steps for producing a logic gate with low-frequency modulated trough and oxide insulation;

FIGS. 10a to 10f depict the individual process steps for producing a logic gate with trench insulation, and FIGS. 11a to 11d depict the individual process steps for producing photosensitive diodes;

FIGS. 12a to 12c depict the individual process steps for producing an initial illustrative embodiment of a photosensitive transistor with open base;

FIGS. 13a to 13d depict the individual process steps for producing a photosensitive transistor with enhanced photosensitivity;

FIGS. 14a to 14d depict the individual process steps for producing a photosensitive transistor with enhanced withstand voltage;

FIGS. 15a to 15f depict the individual process steps for producing a lateral PNP-transistor.

Figure 1A:
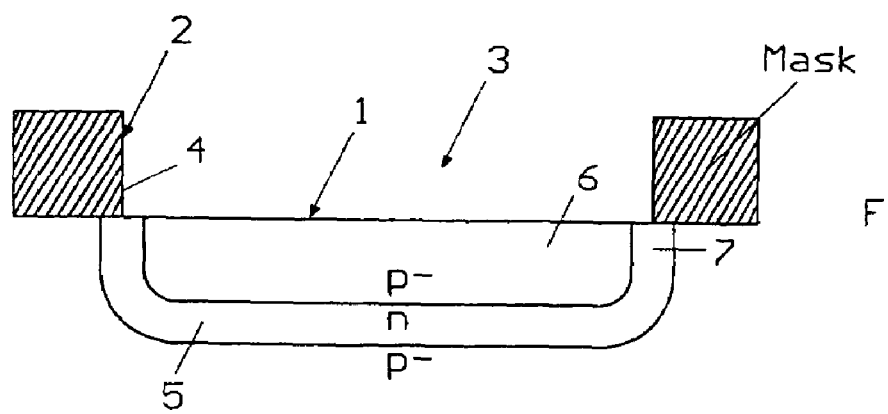
FIGS. 1a to 1c depict the step in production of an n-doped trough in the semiconductor substrate using high energy ion implantation, whereby the mask defining the window for ion implantation is delimited by an edge running perpendicular or tilted inward or outward.
Figure 1B:
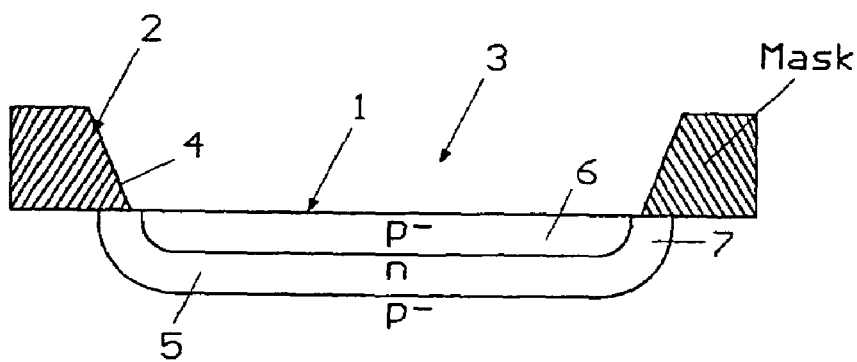
Figure 1C:
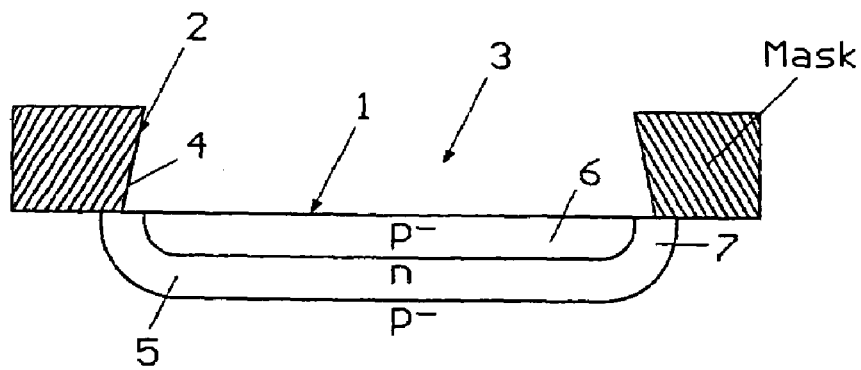

The semiconductor structure described with reference to FIGS. 1a to 1c is the prerequisite for production of the various semiconductor components. In the following, the individual process steps for producing said semiconductor structure are described.

A mask 2 is applied to a weakly p-doped semiconductor substrate 1 (wafer); said mask exhibits a window 3 that is delimited by a peripheral edge 4. A wafer made of a weakly p-doped monocrystalline silicon with a resistance of from, for example, 5 Ohms cm is used as the preferred basic material. Other suitable semiconductor materials are, for example, GaAs and SiC together with the doping agents appropriate for these materials. The mask material can be a photoresist, metal, glass or even another material. Preferably the structure is created by a photolithographic process.

The formation of the edge 4 of the mask window 3 is irrelevant to the further process steps. The edge 4 of the mask window 3 can be formed vertically (FIG. 1a), slanted outward (FIG. 1b) or slanted inward (FIG. 1c).

Following creation of the mask, which can be done using conventional processes, doping is done, preferably an implantation of phosphorous ions at a dose of, for example, $2\times10^{13}$ atoms/cm², in order to create an n-doped trough 5 in the semiconductor substrate 1. The implantation energy in this process is such that over the trough 5 in the semiconductor substrate 1 there still remains a weakly p-doped inner area 6. At a dose of $2\times10^{13}$ atoms/cm² this is, despite the back-scattered phosphorous ions, for example, the case if the implantation energy is 6 MeV phosphorous ions.

With high-energy implantation there is a peculiar effect in the area of the edge 4 of the mask window 3. Since the ions are scattered at the vertical edge or are slowed down at different intensities at the slanted edges, a fringe area 7 forms extending upwards in the trough 5, said area extending as far as the surface of the semiconductor substrate 1 and encloses the remaining p-doped area 6 at the surface of the semiconductor substrate.

To produce an integrated circuit and by using an appropriate mask, a number of n-doped troughs, whose fringe areas extend to the semiconductor substrate surface, can be inserted using ion implantation.

Alternatively, however, ion implantation can also be done using an energy that is sufficient to cause a p-doped inner area to remain at the surface of the semiconductor substrate. For example, at an implantation energy of 2 MeV and a dose of $2\times10^{13}$ atoms/cm², the back-scattered phosphorus ions reach the surface of the wafer in sufficient number and no weakly p-doped area remains but an n-doped semiconductor with a concentration of $N_p>10^{15}/cm^{-3}$ does. This is prevented in that either a wafer with an overall higher p-concentration is used as the starting material or additional doping is inserted into the wafer surface for the purpose of compensation. This can be done by implantation or diffusion. For example, compensation can be produced with an implantation energy of 200 KeV and a dose of $3\times10^{11}$ atoms/cm² to a depth of 8 µl. However, these are merely reference values that can be changed multiply. The re-doping can be done over the entire surface or only within the trough using a mask.

Starting with the semiconductor structure described with reference to FIGS. 1a to 1c various transistor types can be produced.

Figure 2A:
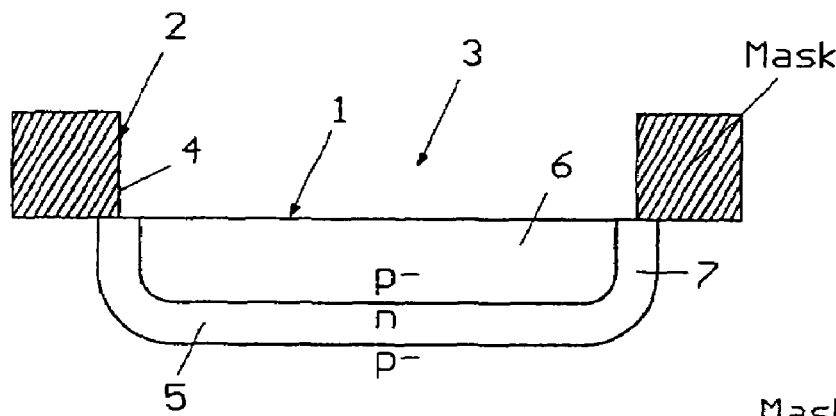
FIGS. 2a to 2e depict the further process steps for producing an NPN-transistor starting with the semiconductor structure depicted in FIGS. 1a to 1c.
Figure 2B:
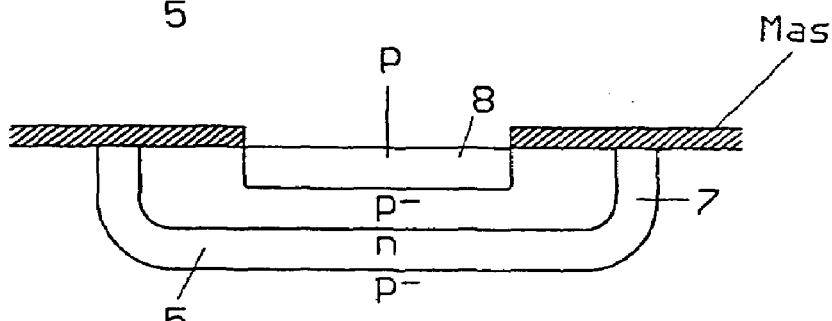
Figure 2C:
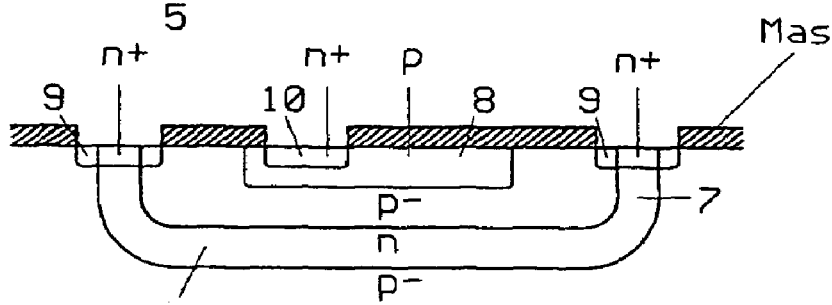
Figure 2D:
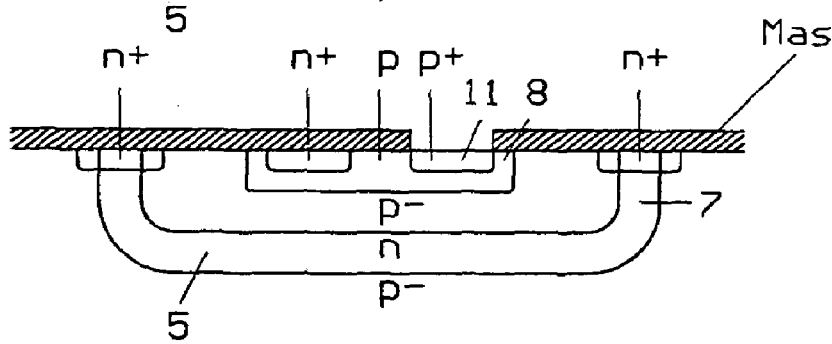
Figure 2E:
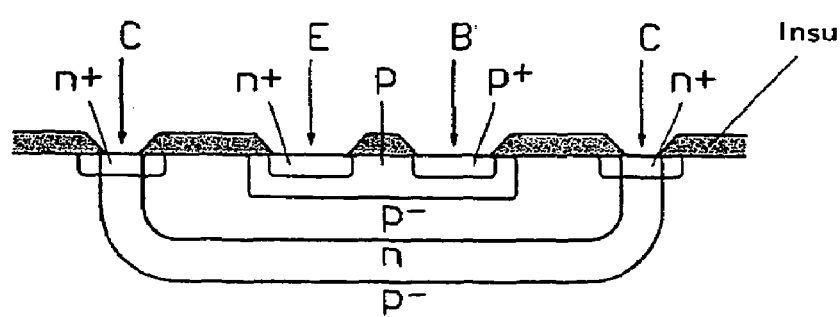

FIGS. 2a to 2e illustrate the steps for producing an NPN-transistor. In the p-doped inner area 6 of the semiconductor structure (FIG. 2a) enclosed by the n-doped trough of FIGS. 1a to 1c, a central rectangular, round or other shaped p-doped area 8 is inserted using ion implantation and using conventional doping ($N_A=10^{18}$ cm⁻³) which is heavier than that of the semiconductor substrate (FIG. 2b). Then, using ion implantation, a shallow peripheral n⁺-junction area 9 having the conventional doping concentration ($N_D\sim10^{22}$ cm⁻³) in the fringe area 7 of the trough 5 and a shallow n⁺-doped area 10 ($N_D\sim10^{22}$ cm⁻³) is inserted in the p-doped area 8 enclosed by the inner area 6 (FIG. 2c). In a further implantation step a shallow p⁺-doped junction area 11 ($N^D=10^{22}$ cm⁻³) is inserted into the p-doped area 8 (FIG. 2d). Finally, the insulation area (not shown) can be constructed and the bonding of the transistor connectors to the n⁺ or the p⁺ junction areas can be done using the conventional processes (vide supra: G. R. Wilson). In this illustrative embodiment the n-doped trough 5 forms the collector C, the p-doped inner area 6 together with the p-doped area 8, the base B, and the n+-doped area 10 forms the emitter of the NPN-transistor (FIG. 2 e).

Production of a PNP-transistor likewise starts with the semiconductor structure depicted in FIGS. 1a to 1c. Using ion implantation, a central n-doped area 12 ($N_D\sim10^{18}$ cm$^{-3}$) is inserted (FIG. 3b) into the p-doped inner area 6 (FIG. 3a). Then, using ion implantation, a peripheral shallow n+-junction area 13 ($N_D=10^{22}$ cm$^{-3}$) is inserted into the fringe area 7 of the trough 5 and a shallow, lateral n+-junction area 14 ($N_D=10^{22}$ cm$^{-3}$) is inserted into the central n-area 12 (FIG. 3c). Then, in a further process step, a peripheral shallow p+-junction area ($N_D=10^{22}$ cm$^{-3}$) is inserted into the inner area 6 and a lateral shallow p+-area 16 ($N_D=10^{22}$ cm$^{-3}$) is inserted into the central n-area 12 using ion implantation. The p-inner area 6 now forms the collector C, the central n-area 12 the base B and the p+-area 16 the emitter E of the PNP-transistor, whereby the highly-doped junction areas are provided for producing an ohmic connection to the transistor terminals (FIGS. 3d and 3e). The bonding of the transistor terminals can be done using conventional processes. In order to increase the turnover/breakdown voltage between emitter and collector, in practical applications base and trough can be electrically connected to one another.

FIGS. 4a to 4f depict the process steps for producing a further embodiment of an NPN-transistor that is characterized by a high gain (super-beta-transistor). Starting with the semiconductor structure (FIG. 4a) of FIGS. 1a to 1c, an n-doped area 17 ($N_D=10^{18}$ cm$^{-3}$) is produced in the inner area 6 by means of ion implantation (FIG. 4b). Then, using ion implantation, a peripheral shallow n+-junction area 18 ($N^D=10^{22}$ cm$^{-3}$) in the fringe area 7 of the trough 5 and a shallow n+-junction area 19 ($N_D=10^{22}$ cm$^{-3}$) in the n-area 17 are produced by means of ion implantation (FIG. 4c). Thereafter a shallow p+-junction area 20 ($N_D=10^{22}$ cm$^{-3}$) is produced in the inner area 6 using ion implantation. The trough 5 now forms the collector C, the inner area 6 the base B, and the n-area 17 the emitter E of the super-beta-NPN-transistor. At the junction areas 18, 19, and 20 bonding of the transistor terminals is again done. In the above embodiment of the invention, the stack consisting of the n-doped area 17 and the n+-doped area 19 are not unconditionally required; in principal, the n+-doped area 19 is sufficient. The stack, however, reduces the risk of metallic shorting, whereby the efficacy is improved. The n+-doped area 19 does not even have to lie within the n-doped area 17. Areas 17 and 19 can also overlay or only partially overlap each other.

FIG. 4f depicts a partial view of the embodiment as described in FIGS. 4a to 4e, in which the n+-doped area 19 and the n-doped area 17 overlay each other without area 19 being enclosed by area 17.

FIGS. 5a to 5e depict the process steps for producing an I$^2$L element starting with FIGS. 1a to 1c. Initially n-doped areas, for example four n-doped areas 21, 22, 23, 24 ($N^D\sim10^{18}$ cm$^{-3}$) are inserted into the inner area 6 by means of ion implantation. Area 21 extends from the fringe area 7 of the trough 5 into the fringe region of the inner area 6 (FIG. 5b). In the next process step, a peripheral shallow n+-junction area 25 ($N_D\sim10^{22}$ cm$^{-3}$) in the fringe area 7 of the trough 5 and in the n-doped areas 22, 23, 24 further shallow n+-junction areas 26, 27, 28 ($N_D=10^{18}$ cm$^{-3}$) are produced using ion implantation. In the n-area 21 that connects the fringe area 7 of the trough 5 with the inner area 6 a shallow p+-doped area 29 ($N_D=10^{22}$ cm$^{-3}$) is produced. A further p+-junction area 30 ($N_D=10^{22}$ cm$^{-3}$) is inserted into the inner area laterally adjacent to the n+-junction areas 26, 27, 28.

The inner area 6 then forms the base of a multi-collector transistor, while the n-areas 22, 23, 24 form the individual collectors C1, C2, C3 of the inversely operated transistor. The injector terminal INJ is created at the p+-area 29 and the terminal of the base B at the junction area 30 and the collectors C1, C2, C3 at the junction areas 26, 27, 28 using conventional bonding processes (FIG. 5e). The feed of the supply current into the I$^2$L element via an injector PNP is only a preferred version. Even a high-ohm resistance or a current source/power supply are conceivable.

Figure 6A:
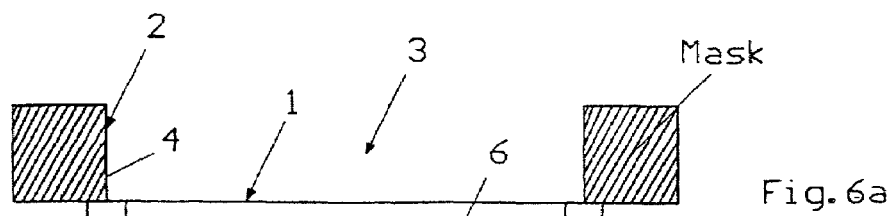
FIGS. 6a to 6f depict the individual process steps for producing a field effect transistor starting with the semiconductor structure depicted in FIGS. 1a to 1 c.
Figure 6B:
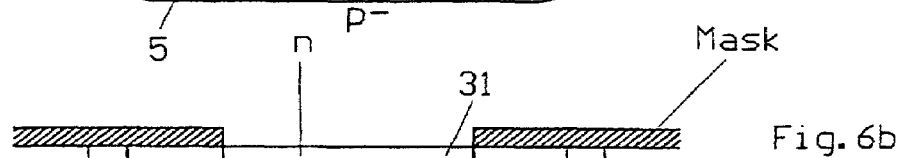
Figure 6C:
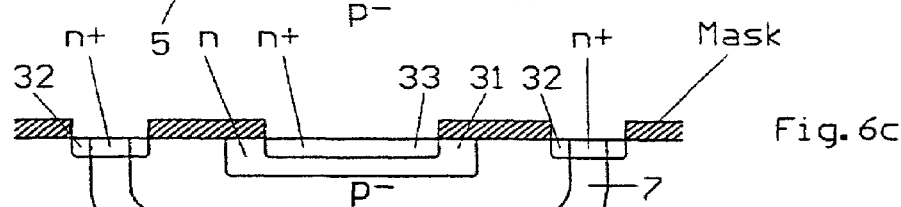
Figure 6D:
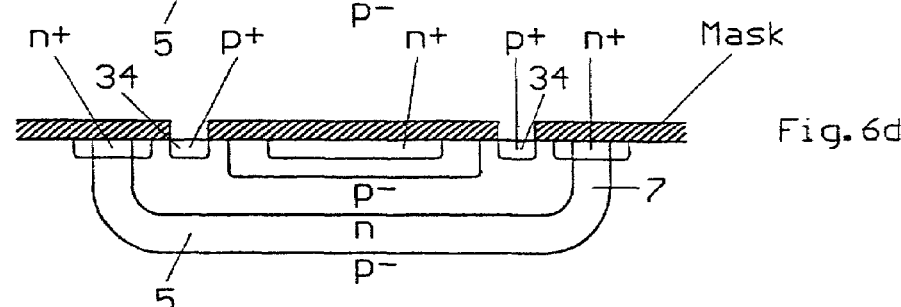
Figure 6E:
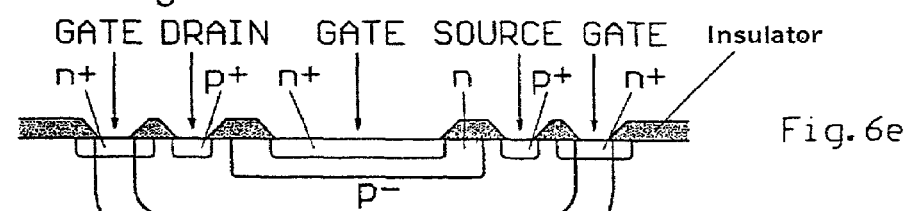
Figure 6F:
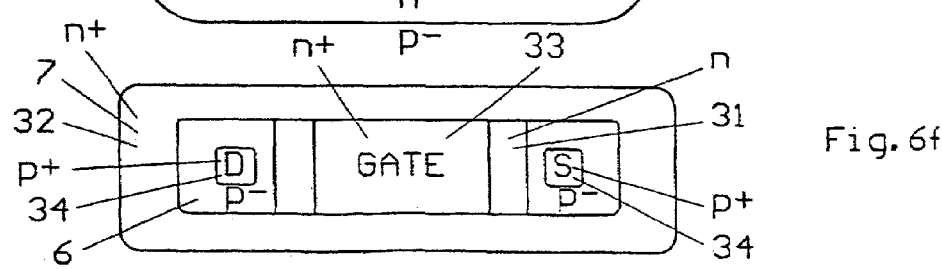

FIGS. 6a to 6f depict the process steps for producing a field effect transistor which is characterized by high turnover/breakdown voltage and slope. Fabrication is based on FIGS. 1a to 1c (FIG. 6a). Using ion implantation, a rectangular n-doped area 31 is inserted into the p-doped inner area 6 of the trough 5; said rectangular n-doped area extends over the entire width, but not over the entire length of the inner area 6, such that the inner area is separated into two regions (FIG. 6b). Then, using ion implantation, a peripheral shallow n+ junction area 32 ($N_D=10^{22}$ cm$^{-3}$) is inserted into the fringe area 7 of the trough 5 and a shallow n+ junction area 33 ($N_D=10^{22}$ cm$^{-3}$) is inserted into the n-area 31. Said areas form the gate of the transistor (FIG. 6c). Then, in each of the two regions of the inner area 6 one p+-doped area 34 ($N^D=10^{22}$ cm$^{-3}$) is produced (FIG. 6d). The p+-doped implants 34 represent the junction areas for metal bonding of drain and source of the transistor (FIG. 6e). FIG. 6f depicts the field effect transistor viewed from above.

The method for producing the various transistor types is advantageous inasmuch as the costly epitaxy and insulation steps are eliminated. All transistor types can be produced starting with the same semiconductor structure using the described process steps simultaneously in a common production process. The individual process steps for producing the n-doped or p-doped areas in the semiconductor structure can also be done in a sequence other than that described in the above illustrative embodiments. Generally, arsenic or phosphorus ions with an energy of 5 to 50 keV are used for n+ implant ions. The energies for the n-implant ions are correspondingly higher at 30 to 100 keV. In p– and p+ implant ions generally boron ions are used with comparable energies as in the n– and n+ implant ions. The indicated concentrations and energies are values used in practice and can be increased or decreased. Other methods for introducing the doping are also possible. Interruptions of the doped areas are likewise possible. n and n+ or p and p+ as stacks with or without overlap are not absolutely necessary; n+ or p+ are sufficient. If, however, an n and a p implant ion are below, this arrangement reduces the risk of metal shorting by the n+ or p+ layers and consequently improves efficacies and can change the electrical data of the components. With the base terminal and drain/source n or p can be underlying. Therein the masking can be done using the photolithographic processes in the practice.

In order to make possible a particularly low-impedance bulk resistor it is advantageous if the junction area in the fringe area of the n-doped trough is not designed as a shallow area but as an area that extends deeper into the semiconductor substrate. Thus, the junction area can, for example, extend to a depth at which the n-doped trough lies. However, to achieve this an additional process step is required.

The geometric arrangement of collector, emitter, and base in the trough is depicted in the illustrations for exemplar purposes only. Both size and length can be changed. Structures described as rectangles can have also other shapes; for example, round shapes.

Along with the components described above, further logic gate types can be produced in a common production process starting with the semiconductor structure described with reference to FIGS. 1a to 1c. FIGS. 7 to 10 depict the individual steps of various methods for producing logic gates, which are based on said semiconductor structure, whereby the masks and areas corresponding to each other are identified with the same reference symbols.

FIG. 7a depicts the step for producing the n-doped trough 5 in the semiconductor substrate 1 by means of high-energy implantation. The mask 2 with the window 3 is applied to the semiconductor substrate such that during implantation the elevated fringe area 7 is formed in the trough 5 and extends as far as the surface of the semiconductor substrate and encloses the remaining p-doped inner area 6 at the surface of the semiconductor substrate (compare with FIGS. 1a to 1c).

Then the active regions of the logic gate are separated in the semiconductor substrate in which further n-doped and/or p-doped areas are inserted for the purpose of forming the logic gate. For separation, using ion implantation, an n-doped separation area 35 is produced, which extends into the n-doped trough, surrounding the active region in the inner area 6 of the semiconductor substrate. The implantation is done after application of a mask 36 using conventional processes. With said implanted insulation a number of regions can be separated in the semiconductor substrate which lie densely alongside each other, in order to achieve a high packing density. The further steps in producing a logic gate in one of these regions is described in the following.

After application of an additional mask 37, for example, a rectangular n-doped area 38 and a, for example, rectangular n-doped area 39 are produced in the p-doped inner area 6, whereby areas 38, 39 extend beyond the separation area 35 or lie within the separation area 35. Between the n-doped areas 38, 39 two, for example rectangular, n-doped areas 40, 41 are inserted alongside one another into the p-doped area 6. The creation of the n-doped areas 38 to 41 is done by means of ion implantation using the conventional method (FIG. 7c).

After application of a further mask 42 in the external n-doped area 38, a shallow n$^+$-doped junction area 43 is produced for the terminals of the logic gate, while within the external n-doped area 39 a shallow n$^+$-doped junction area 44 is produced. In the inner n-doped areas 40, 41 similar shallow n$^+$-doped junction areas 45, 46 are created (FIG. 7d).

Thereupon, a further mask 47 is applied in order to produce a shallow p$^+$-doped junction area 48 in the internally situated region of the outer n-doped area 38 and a shallow p$^+$-doped junction area 49 in the inner area 6 between the internal n-doped area 41 and the external n-doped area 39 (FIG. 7e).

An insulation layer 50 is applied to the semiconductor structure and is exposed in the region of the terminals. The trough terminal W is made at the external n$^+$-doped junction areas 43, 44; the terminal of the injector Inj. for the supply current at the p$^+$-doped junction area 48, which lies within the external n-doped area 38, the gate terminals $C_1$, $C_2$ at the inside n$^+$-doped junction areas 45, 46 and the terminal B for control of the gate at the p$^+$-doped junction area 49 (FIG. 7f).

In the logic gate described with reference to FIG. 7 the active area is separated by an implanted separation area. FIG. 8 depicts a method in which an additional implantation is not required for separation of the active area. The method according to FIG. 8 differs from the method according to FIG. 7 in that the creation of the starting structure by high-energy implantation is done by using an additional mask. The individual masks and areas in FIG. 8 that correspond to those of FIG. 7 are keyed using the identical reference identifiers.

FIG. 8a depicts the starting structure which, with the exception of the use of the additional mask, is produced using the method described with reference to FIGS. 1a to 1c. Prior to ion implantation a second mask 51, which encloses the region to be separated, is applied in a second lithography step onto the semiconductor substrate within the window 3 of the mask 2. The second mask 51 has a lesser thickness than that of the first mask; it is approximately half as thick.

After placement of the mask, doping is carried out, preferably implantation of phosphorus ions using a dose of, for example, $2 \times 10^{13}$ ions/cm$^2$, in order to create the n-doped trough 5 in the semiconductor substrate. In said process the region of the trough 5 covered by the second mask 51 is drawn upward. Then the n-doped areas 38, 39, 40, 41 in the p-doped inner area 6 are produced, whereby the outlying n-doped areas 38, 39 extend as far as the elevated region of the trough 5 (FIG. 8b). The process step according to FIG. 8b corresponds to the step according to FIG. 7c. The separation of the active area by the trough 5 drawn upward in conjunction with the externally situated n-doped areas 38, 39 makes possible an even higher packing density. Two further doping steps follow and correspond to those of FIGS. 7d to 7f. At all events a further opening 51 is exposed in the mask 42' over the elevated fringe area 7 of the trough 5, in order to create a further n$^+$-doped junction area 52 that serves in the connection of the trough (FIG. 8c). The insulation layer 50' over the n$^+$-doped junction area 43 or 53 is exposed for the trough connection (FIG. 8e).

The process described with reference to FIG. 9 starts with the semiconductor structure which is produced in the steps as in the case of the semiconductor substrate pursuant to FIG. 8a. However, for the separation of the active region, an oxide layer 53, 54 is applied, which extends as far as the trough, in lieu of the n-doping above the elevated region of the trough 5 (FIG. 9a). Thereupon further doping steps follow, with the exception of those of FIGS. 8b to 8e, in that the doping above the elevated area of the trough 5 are eliminated and the outlying n-doped area 38' and the n$^+$-doped junction area 43' merely approximate or extend only minimally into the oxide layer 53, but not over the elevated region of the trough 5. The modified masks are identified with the references 42", 47'. In order to create a terminal for the base of the injector Inj. the insulation layer 50" is exposed above the junction area 43' (FIG. 9e). Otherwise the terminals are provided as in the logic gate according to FIG. 8.

FIGS. 10a to 10f depict the individual process steps for producing a logic gate in which the active area is separated by trenches. The process again starts with a semiconductor substrate with an elevated trough 5 (FIGS. 1a to 1c). In the p-doped inner area 6 n-doped areas 38, 40, 41 are again produced after application of mask 37 (FIG. 10b). After application of an additional mask 42" n$^+$-doped junction areas 43, 45, 46, 55 are produced (FIG. 10c) in areas 38, 40, 31 and in the region of the elevated edge 7 of the trough 5. Thereupon, after application of a further mask 47, a p$^+$-doped area 49 is created in the inner area 6 and a p$^+$-doped area 48 is created in the internal region of the external n-doped area 38 (FIG. 10d). At this point separation of the active region is done by two trenches 56, 57 extending into the trough 5 lateral to the p$^+$-doped area 49 and the n-doped area 38 (FIG. 10e). The trenches are then re-filled using the conventional method. FIG. 10f depicts the semiconductor substrate covered with the insulation layer 50" with the terminals for the logic gate.

The individual doping steps for producing the logic gate can be carried out in various sequences. Thus, for example, it is not absolutely necessary to carry out the process steps for separation of the active areas of the logic gate before the doping steps for producing the logic gate. Moreover, the individual doping steps can initially be done and the active regions of the logic gate separated later using the method described above.

Semiconductor structures other than those described above can be produced by using the basic structure and separating individual regions.

The dimensions of the overlap of the various dopings are the result of following the conventional rules of production. Double implantation of the same species at one site with $n^+$ over n or $p^+$ over p can then be eliminated at said site if a terminal surface is not required or a pn junction already exists with an implantation.

Implantation can be done according to the conventional rules through the window of the insulator (autoregulation) or several implantations can be done through the same mask. The separation of the doping is done by diffusion or oblique implantation. Other methods familiar to the specialist for production of the PN junctions and terminals can also be reasonably used as, for example, dopings comprised of a poly Si layer.

Figure 11A:
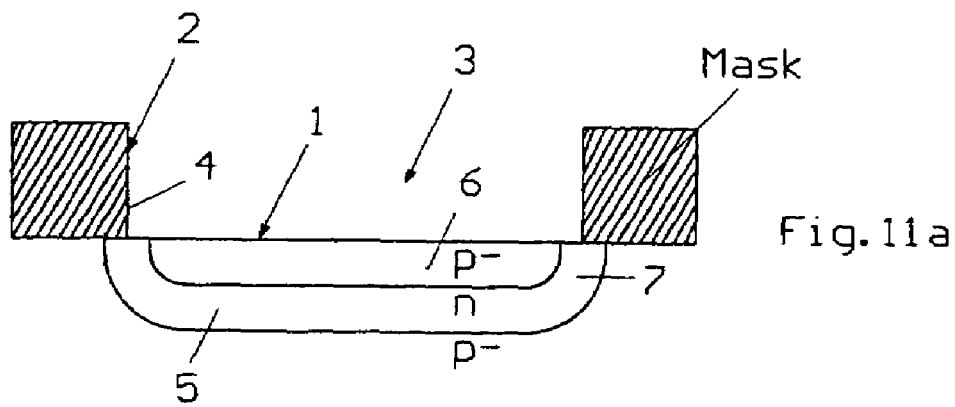
Figure 11B:
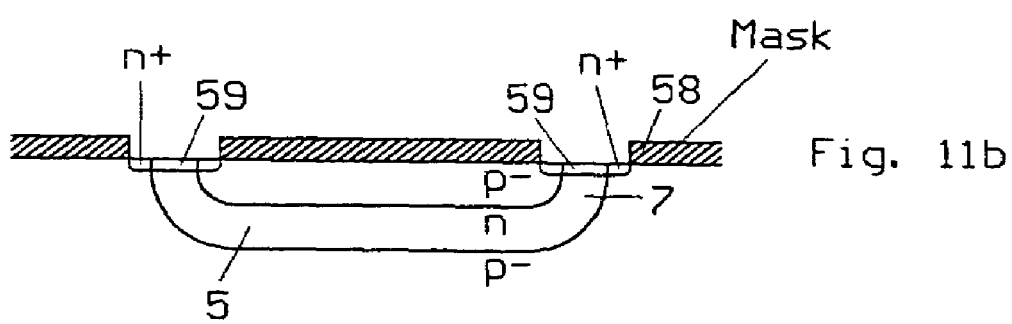
Figure 11C:
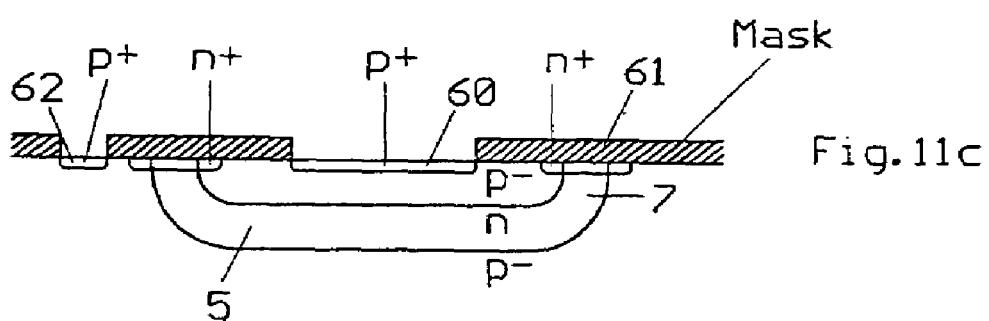
Figure 11D:
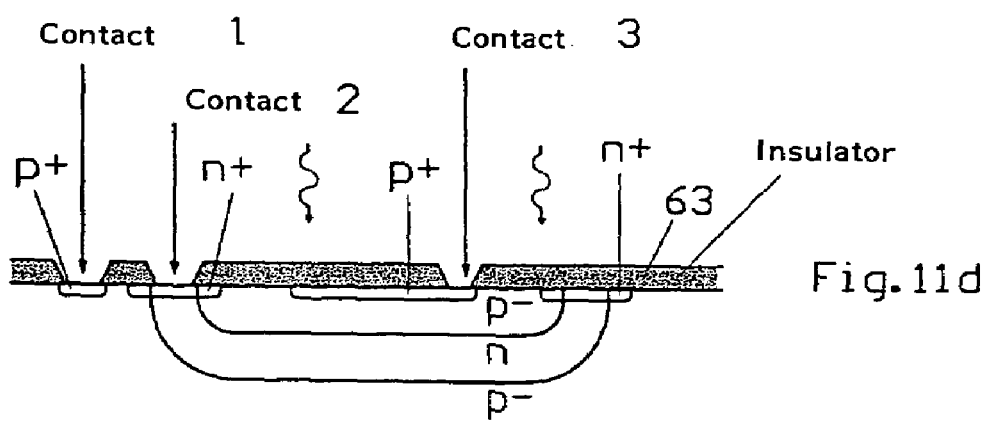

FIGS. 11a to 11d depict the individual process steps for producing photosensitive diodes on the basis of the semiconductor structure described with reference to FIGS. 1a to 1c. For the purpose of bonding the n-doped trough 5, after application of a mask 58 in the fringe area 7 of the inner area 5 reaching to the surface of the semiconductor substrate 1a peripheral, shallow $n^+$-doped junction area 59 is implanted (FIG. 11b). The bonding of the p-doped inner area 6 is done with a shallow $p^+$-doped junction area 60, which, after application of a mask 61, is implanted in the inner area 6. At the same time a further shallow $p^+$-junction area is implanted outside of the trough 5 in the semiconductor substrate 1 (FIG. 11c). Then a translucent insulation layer 63 is applied onto the semiconductor substrate 1 which is exposed in the regions of the junction areas 59, 60, 62. At the exposed regions of the insulation layer 63 bonding is established with contacts/terminals 1 to 3. Thus two PN junctions are created. The terminals of the first photosensitive diode form contacts 1 and 2, while contacts 2 and 3 form the terminals for the second photosensitive diode. Because of the varying depth of the PN junctions, both diodes are disposed of a high spectral sensitivity at various wavelengths. The first diode is sensitive for short-wave light and the second diode is for long-wave light. Based on the semiconductor structure according to FIGS. 1a to 1c, however, only one of the two diodes can be produced.

In the following, various methods for producing photosensitive transistors with open base are made clear based on the semiconductor substrate described with reference to FIGS. 1a to 1c.

After application of a mask 64 a peripherally oriented, shallow $n^+$-doped junction area 65 is implanted, as in the manufacture of the diodes (FIGS. 11a to 11d), in the elevated fringe area 7 of the n-doped trough 5. An $n^+$-doped area 66 is implanted in the $p^-$-doped inner area 6 (FIG. 12b). Thereupon a translucent insulation layer 67 is applied onto the semiconductor substrate which is exposed in the region of the $n^+$-doped junction area 65 as well as in $n^+$-doped area 66. Bonding of the terminals for the emitter E and collector C is done in the exposed regions of the insulation area 67.

Figure 13A:
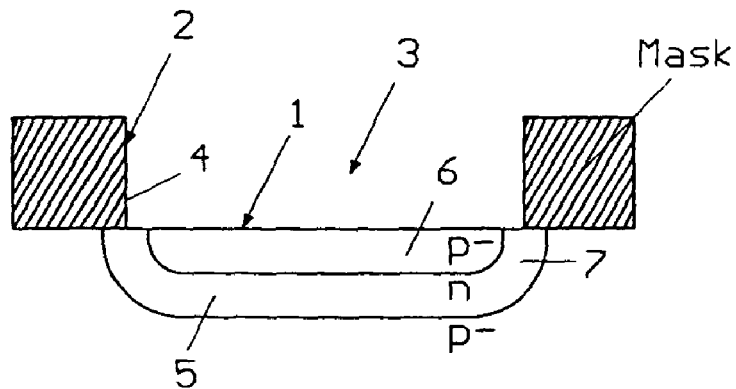
Figure 13B:
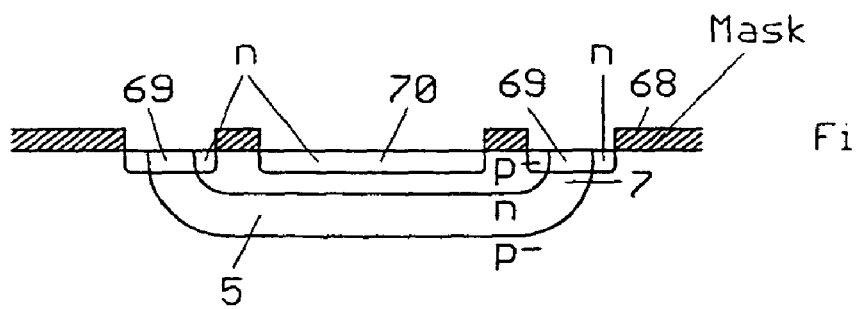
Figure 13C:
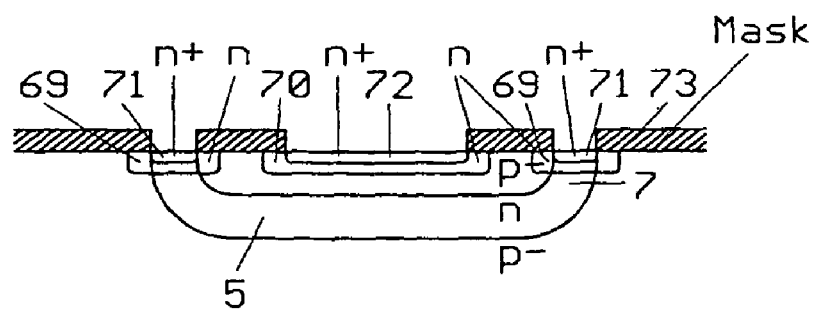
Figure 13D:
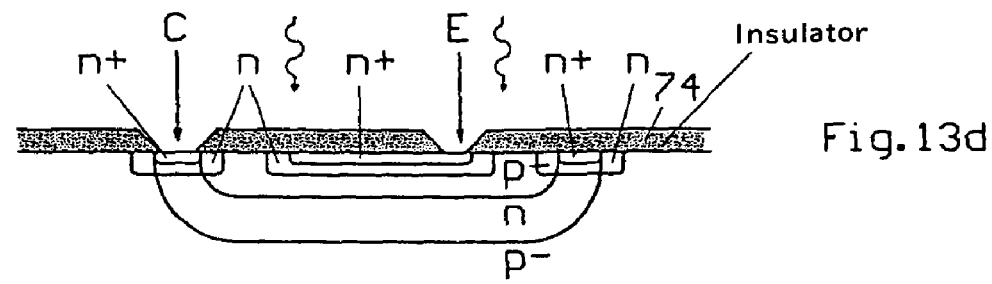

The photosensitivity of the phototransistor according to FIGS. 12a to 12c can be increased by additional implantation with n-doped material. FIGS. 13a to 13d depict the individual process steps for producing a photosensitive transistor with increased photosensitivity on the basis of the semiconductor structure according to FIGS. 1a to 1c. After application of a mask 68 a peripheral n-doped area 69 is implanted in the elevated fringe area 7 of the n-doped trough 5. At the same time an n-doped area 70 is implanted in the $p^-$-doped inner area 6 (FIG. 13b). Thereupon a shallow $n^+$-doped junction area 71 is implanted in the peripheral n-doped area 69. An $n^+$-doped area 72 is similarly implanted in the central n-doped area 70. The implantations are done after application of a mask 73 (FIG. 13c). Thereupon a translucent insulation layer 74 is applied that is exposed over the $n^+$-doped junction area 71 and the $n^+$-doped area 72. At the exposed sites the bonding of the emitter E and the collector C is again carried out (FIG. 13d).

Figure 14A:
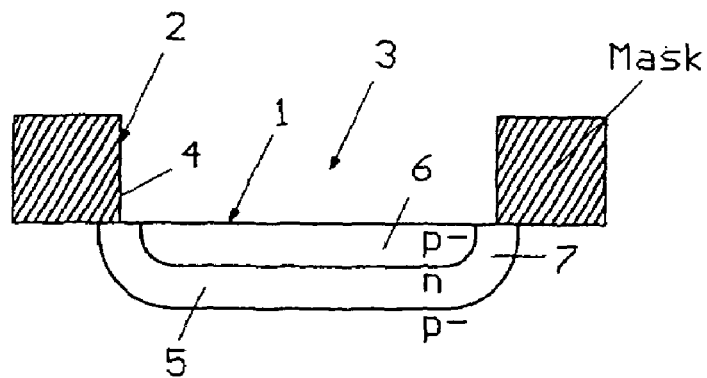
Figure 14B:
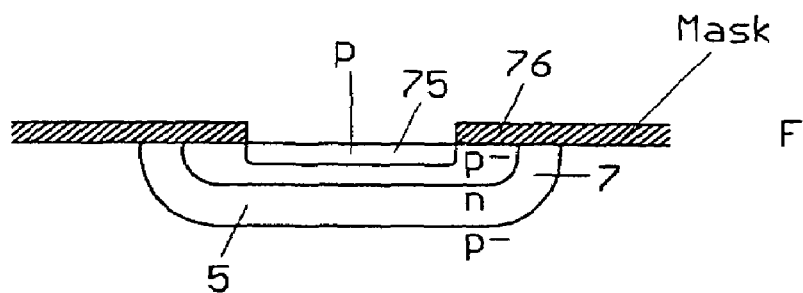
Figure 14C:
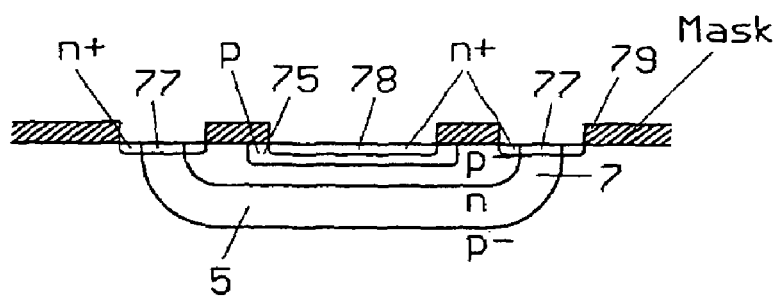
Figure 14D:
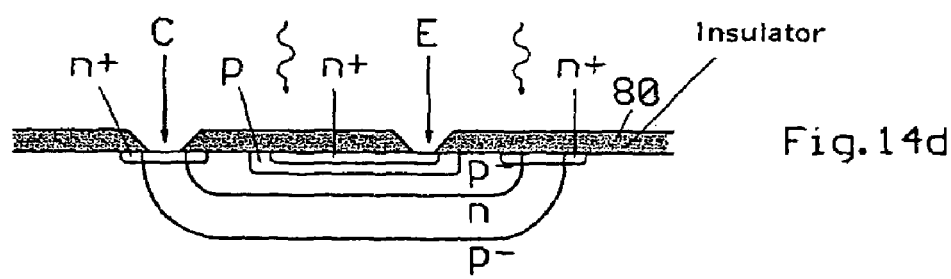

A photosensitive transistor with increased withhold voltage, but reduced photosensitivity can be created by additional implantation with p-doped material. FIGS. 14a to 14d depict the individual production steps of such a phototransistor. The production process differs from the process described with reference to FIGS. 13a to 13d in that after application of a mask 76 it is not an n-doped but a p-doped area 74 that is implanted in the p-doped inner area 6 (FIG. 14b). In the elevated fringe area 7 of the n-doped trough 5 a shallow $n^+$-doped junction area 77 and a further $n^+$-doped junction area 78 is then implanted in the p-doped area 75. The implantation is again done after application of a mask 79 (FIG. 14c). A translucent insulation layer 80 which is exposed over the $n^+$-doped junction area 77 and the $n^+$-doped junction area 78 for the terminals of the emitter E and the collector C, covers the semiconductor substrate (FIG. 14d).

Starting with the semiconductor structure described with reference to FIGS. 1a to 1c a lateral PNP-transistor can be produced as described below.

Figure 15A:
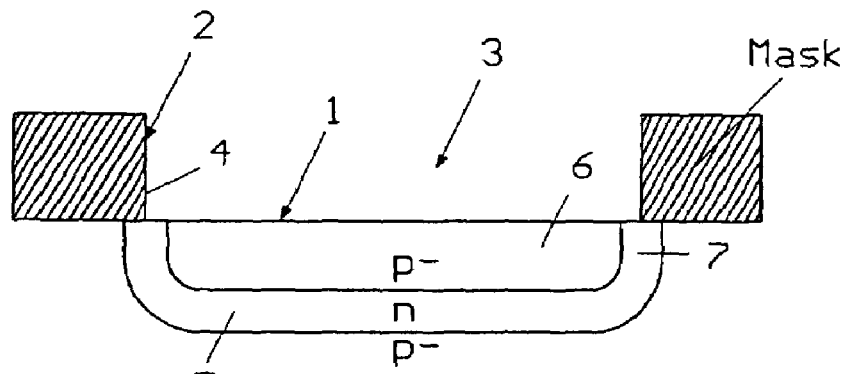

FIG. 15a depicts the step for producing the n-doped trough 5 in the semiconductor substrate 1 by means of high-energy implantation. The mask 2 with the window 3 is applied to the semiconductor substrate so that during the ion implantation the elevated fringe area 7 forms in the trough 5; said fringe area extends as far as the surface of the semiconductor substrate and the remaining $p^-$-doped inner area 6 and wraps around at the surface of the semiconductor substrate.

Figure 15B:
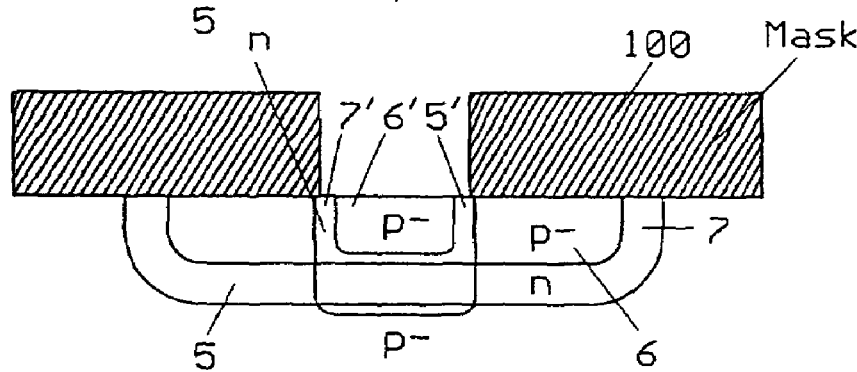

A further high-energy ion implantation in the inner area 6 using a mask with n-doping and a dose of approximately $1 \times 10^{13}/cm^2$ is done in a manner similar to that depicted in FIGS. 1a to 1c. A trough 5' is formed in the trough 5 with a residual $p^-$-inner area 6' and an elevated fringe 7' as far as the surface of the substrate (FIG. 15b).

Figure 15C:
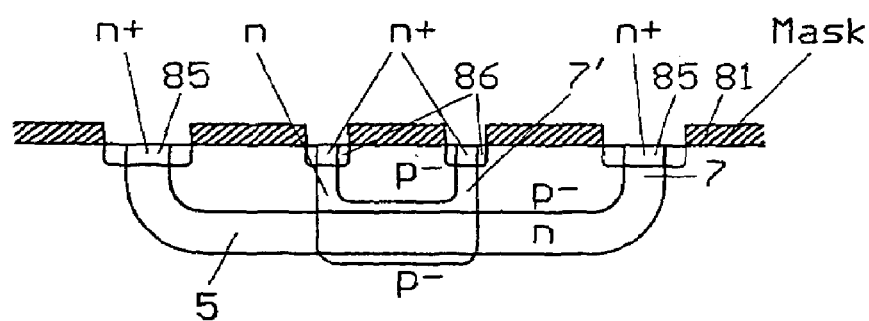
Figure 15D:
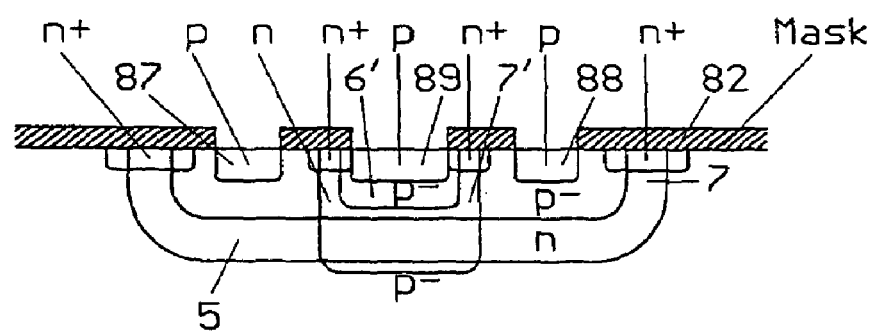

After application of the mask 81 shallow $n^+$-terminal dopings are implanted in the peripheral areas 85 and 86 (FIG. 15c). Mask 82 defines the region 87 and 88 within the trough 5 and region 89 within the trough 5' (FIG. 15d). Said implantation can also be omitted. Mask 83 defines the shallow $p^+$-terminal implantation in the areas 90 and 91 (FIG. 15e).

The regions 85 and 86 freed of the insulation 84 are the base terminals, regions 90 and 91 are the collector terminals, region 92 is the emitter terminal of the PNP. The elevated fringe 7' of the trough 5' forms the base of the lateral PNPs. The trough 5 with the elevated fringe 7 serves as insulation and can be used as a base terminal as can the elevated fringe 7' of the trough 5'. The gain of the transistor can be set by the implant ion dosage of trough 5'.

The invention claimed is:

1. A method for producing integrable semiconductor components, in particular transistors, diodes, and logic gates, starting with a weakly p-doped or weakly n-doped semiconductor substrate in the following steps:
   application of a mask onto the semiconductor substrate for definition of a window delimited by a peripheral edge;
   production of an n-doped trough in the p-doped semiconductor substrate or p-doped trough in the n-doped semiconductor substrate by means of ion implantation through the mask using a high energy that assures that a weakly p-doped inner area remains on a surface of the p-doped semiconductor substrate or a weakly n-doped inner area remains on a surface of the n-doped semiconductor substrate, wherein a fringe area of the n-doped trough or p-doped trough extends up to the surface of the semiconductor substrate; and
   production of additional n-doped and/or p-doped areas in the p-doped or n-doped inner area and in the fringe area of the n-doped or the p-doped trough that form the structure of the semiconductor component without a step of additional doping of the p-doped inner area or n-doped inner area to prevent turnover of conductivity type.

2. The method of claim 1 wherein, for creation of the structure forming an NPN-transistor, a p-doped area having heavier doping than that of the semiconductor substrate together with the p-doped area enclosed by the p-doped inner area forming the base of the transistor and an n-doped area forming the emitter of the transistor are produced in the p-doped inner area, whereby the n-doped trough forms the collector of the transistor.

3. The method of claim 2, wherein the n-doped area forming the emitter has heavier doping than that of the n-doped trough.

4. The method of claim 2, wherein an n-doped junction area having heavier doping than that of the trough is produced in the n-doped fringe area of the trough and a p-doped area having heavier doping than that of the p-doped area enclosed by the p-doped inner area is produced in the p-doped area enclosed by the p-doped inner area.

5. The method of claim 1, wherein for the creation of a structure forming a PNP-transistor an n-doped area enclosed by the p-doped inner area is produced in the p-doped inner area and forms the base of the transistor and in the n-doped area a p-doped area forming the emitter of the transistor is produced, whereby the p-doped inner area forms the collector of the transistor.

6. The method of claim 5, wherein the p-doped area forming the emitter of the transistor has heavier doping than that of the semiconductor substrate.

7. The method of claim 5, wherein in the n-doped fringe area of the trough an n-doped area having heavier doping than that of the trough and in the n-doped area forming the base an n-doped area having heavier doping than that of the n-doped area forming the base and in the p-doped inner area a p-doped area having heavier doping than that of the p-doped inner area are produced.

8. The method of claim 1, wherein for the creation of the structure forming an NPN-transistor having high gain in the p-doped inner area an n-doped area forming the emitter of the transistor is produced, whereby the p-doped inner area forms the base and the n-doped trough forms the collector of the transistor.

9. The method of claim 8, wherein an n-doped area having heavier doping than that of the trough and in the n-doped area forming the emitter an n-doped area having heavier doping than that of the area forming the emitter and in the p-doped inner area a p-doped area having heavier doping than that of the p-doped inner area are produced in the fringe area of the n-doped trough.

10. The method of claim 1, wherein an n-doped area joining the fringe area of the n-doped trough with the p-doped inner area and in the p-doped inner area at least one n-doped area are produced for the creation of the structure forming an I²L element, whereby the p-doped inner area forms the base of a multi-collector transistor and at least one n-doped area enclosed by the p-doped inner area forms the individual collectors of the transistor.

11. The method of claim 10, wherein in the n-doped area joining the fringe area of the n-doped trough with the p-doped inner area a p-doped area is inserted.

12. The method of claim 11, wherein a p-doped area having heavier doping than that of the semiconductor substrate and in the at least one n-doped area enclosed by the p-doped inner area an n-doped area having heavier doping than that of the n-doped area are produced in the p-doped inner area.

13. The method of claim 1, wherein for the creation of a structure forming a field effect transistor an n-doped area forming the gate of the transistor is formed in the p-doped inner area, which partitions the p-doped inner area into two regions one of said regions forming the drain and the other region forming the source of the transistor.

14. The method of claim 13, wherein a p-doped area having heavier doping than that of the p-doped inner area is inserted in the regions of the p-doped inner area forming the drain and the source, respectively.

15. The method of claim 13, wherein an n-doped area having heavier doping than that of the n-doped area forming the gate is inserted into the n-doped area forming the gate.

16. The method of claim 1, wherein an n-doped area enclosing each active area is produced in the semiconductor substrate for the purpose of separation of active areas for individual semiconductor components.

17. The method of claim 16, wherein the n-doped area enclosing the active area extends up to the n-doped trough of the semiconductor substrate.

18. The method of claim 1, wherein for the separation of active areas for individual semiconductor components in the semiconductor substrate prior to ion implantation a mask enclosing each active area is applied to the semiconductor substrate and after application of the mask the n-doped trough is produced in the semiconductor substrate by means of ion implantation, such that the trough is pulled up in the area underlying the mask.

19. The method of claim 18, wherein an n-doped area that extends up to the raised area of the n-doped trough is produced in the semiconductor substrate.

20. The method of claim 18, wherein an oxide layer in the semiconductor substrate produces an area of the n-doped trough reaching upward to beneath the oxide.

21. The method of claim 1, wherein active areas for the individual semiconductor components are separated in the semiconductor substrate by trenches.

22. The method of claim 16, wherein n-doped or p-doped areas for the creation of the structures forming the semiconductor components are produced in the active areas.

23. The method of claim 1, wherein for the creation of the structure forming a photosensitive diode at the fringe area of the n-doped trough an initial terminal is created and at the p-doped inner area a second terminal is created.

24. The method of claim 1, wherein for the creation of the structure forming a photosensitive diode in the semiconductor substrate outside of the n-doped trough a p-doped area is implanted, whereby the first terminal is created at the p-doped area implanted into the semiconductor substrate and the second terminal is created at the fringe area of the n-doped trough.

25. The method of claim 1 employed for the creation of a structure forming a photosensitive transistor in which an n-doped area is implanted into the p-doped inner area, whereby the terminal forming the collector at the fringe area of the n-doped trough and the terminal forming the emitter at the n-doped area implanted into the p-doped inner area is created.

26. The method of claim 1, wherein for the creation of a lateral transistor in the n-doped trough or p-doped trough of the semiconductor substrate an n-doped or p-doped trough forming a second diactive base of the transistor is produced by means of ion implantation.

27. The method of claim 1 wherein the energy of said ion implantation is about 6 MeV.

28. The method of claim 1 wherein the ion implantation energy is 6 MeV phosphorous ions at a dose of $2 \times 10^{13}$ atoms/cm$^2$.

* * * * *